United States Patent
Wei et al.

(10) Patent No.: US 12,306,543 B2
(45) Date of Patent: May 20, 2025

(54) OPTICAL IMAGING METHOD, DEVICE AND SYSTEM FOR PHOTOLITHOGRAPHY SYSTEM

(71) Applicant: Wuhan Yuwei Optical Software Co., Ltd., Hubei (CN)

(72) Inventors: Haiqing Wei, Hubei (CN); Xianhua Ke, Hubei (CN)

(73) Assignee: WUHAN YUWEI OPTICAL SOFTWARE CO., LTD., Hubei (CN)

( * ) Notice: Subject to any disclaimer, the term of this patent is extended or adjusted under 35 U.S.C. 154(b) by 406 days.

(21) Appl. No.: 17/993,715

(22) Filed: Nov. 23, 2022

(65) Prior Publication Data

US 2024/0126179 A1    Apr. 18, 2024

(30) Foreign Application Priority Data

Sep. 29, 2022   (CN) .......................... 202211200847.5

(51) Int. Cl.
 *G03F 7/00*   (2006.01)
 *G03F 1/36*   (2012.01)
 (Continued)

(52) U.S. Cl.
 CPC ............... *G03F 7/705* (2013.01); *G03F 1/36* (2013.01); *G03F 7/70441* (2013.01); *G06F 30/398* (2020.01)

(58) Field of Classification Search
 None
 See application file for complete search history.

(56) References Cited

U.S. PATENT DOCUMENTS

| | | | |
|---|---|---|---|
| 7,079,223 B2 * | 7/2006 | Rosenbluth | G03F 7/705 716/54 |
| 10,210,295 B2 * | 2/2019 | Rosenbluth | G03F 7/70283 |

(Continued)

FOREIGN PATENT DOCUMENTS

| | | | | |
|---|---|---|---|---|
| CN | 110221513 A | * | 9/2019 | ............... G03F 1/36 |
| EP | 1560072 A2 | * | 8/2005 | ............... G03F 1/14 |

OTHER PUBLICATIONS

A.E. Rosenbluth et al., "Fast calculation of images for high numerical aperture lithography," Optical Microlithography XVII, Proc. of SPIE vol. 5377, 2004, pp. 615-628. (Year: 2004).*

(Continued)

*Primary Examiner* — Leigh M Garbowski
(74) *Attorney, Agent, or Firm* — HSML P.C.

(57) ABSTRACT

Methods, devices, and systems of optical imaging simulation for a photolithography system are provided, including: determining a photolithographic imaging model based on a transmission cross coefficient and mask near-field distribution, solving a transmission cross coefficient based on a Lanczos method, using a parity operator to ensure the symmetric properties of the transmission cross coefficient in the numerical solution process to obtain a characteristic kernel functions of the transmission cross coefficient, and solving a photolithographic imaging model by combining the mask near-field distribution and each characteristic kernel function, and obtaining an aerial image of the mask by simulation. The methods, devices, and systems provided can prevent symmetry breaking caused by floating-point errors and improve simulation efficiency as well as simulation precision of a photolithographic imaging system.

10 Claims, 4 Drawing Sheets

(51) Int. Cl.
  *G06F 30/30* (2020.01)
  *G06F 30/398* (2020.01)

(56) References Cited

U.S. PATENT DOCUMENTS 10,846,442 B2 * 11/2020 Ye .............................. G03F 1/62
11,003,092 B2 *  5/2021 Ho ........................ G06F 17/142

OTHER PUBLICATIONS

A. E. Rosenbluth, "Decomposition of the TCC using non-coherent kernels for faster calculation of lithographic images," Optical Microlithography XXX, Proc. of SPIE vol. 10147, 2017, 30 pages. (Year: 2017).*

* cited by examiner

OPTICAL IMAGING METHOD, DEVICE AND SYSTEM FOR PHOTOLITHOGRAPHY SYSTEM

TECHNICAL FIELD

The present invention belongs to the field of photolithography systems, and in particular to an optical imaging method, device, and system for a photolithography system.

BACKGROUND ART

With the development of integrated circuits and semiconductor technology, the minimum line width and spacing of the photolithographic pattern is becoming smaller and smaller. When the critical dimension of the photolithographic pattern reaches below the wavelength of the illumination source used, optical diffraction will cause the system to have an optical proximity effect, which leads to a certain distortion of the exposure pattern formed on the silicon wafer when compared with the mask pattern used, thus affecting the performance of the final product and reducing the yield of the integrated circuit products. Optical proximity correction (OPC) is one of the most important and common optical resolution enhancement techniques to overcome the optical proximity effect. The basic principle is to optimize the design of the mask pattern in advance so that the actual exposure pattern obtained is closer to the desired target pattern.

The optical proximity correction technology includes a photolithography system imaging model and an inverse optimization process thereof, wherein inverse optimization is an iterative process, and each iteration needs to invoke the optical imaging model. Therefore, an accurate photolithography system imaging model is the key to the optical proximity correction technology. An optical imaging system such as a light source and a projection objective often has physical or geometric symmetry. Thus, a corresponding operator of the optical system, such as a four-dimensional transmission cross coefficient (TCC), built by using a Hopkins imaging principle when creating a photolithographic imaging system model, also has the corresponding symmetry to reflect the symmetric properties inherent to the system.

In order to meet the demand of fast and efficient computation, eigen decomposition is often performed with respect to the TCC function, e.g., $TCC = \Sigma_i \lambda_i K_i K_i^+$, and a fast optical imaging computation is achieved by truncating the eigen-decomposed TCC, that is, only retaining the eigenvalues $\lambda$ and characteristic kernel functions K that have a large impact on imaging. However, in the actual numerical computation process, the truncation of the TCC, and the numerical floating-point number error causing the kernel functions K in the iterative process to gradually lose the corresponding symmetry, eventually lead to symmetry breaking of the TCC operator composed of the kernel functions. That is, it causes the TCC representation of the original symmetric system to lose symmetry, which eventually leads to the decline of the efficiency and precision of the forward photolithographic imaging model and seriously affects the cost of the photolithographic production process. Further, the asymmetric TCC operator even has the potential risk of affecting the inverse optimization results, causing the reduction of the process window and the yield of good products. At present, kernel functions can only be selected depending on human experience so that the decomposed TCC operator can satisfy the symmetry requirement as much as possible.

SUMMARY OF THE INVENTION

In response to the defects in the prior art, the purpose of the present invention is to provide an optical imaging method, device, and system for a photolithography system, which aims to solve the problem of symmetry breaking of the TCC operator due to the floating-point number error during the simulation solution process, which causes low efficiency and low precision in mask imaging simulation in the existing optical imaging systems.

To achieve the above purpose, in a first aspect, the present invention has provided an optical imaging simulation method for a photolithography system, comprising the steps of:

determining a photolithographic imaging model based on a transmission cross coefficient and mask near-field distribution, wherein said transmission cross coefficient reflects the physical symmetry of the photolithography system and said photolithographic imaging model is used for simulating a photolithographic imaging process to obtain an aerial image of a mask in the photolithography system;

solving the transmission cross coefficient based on a Lanczos method and using a parity operator to ensure the symmetry of the transmission cross coefficient during the numerical solution process to obtain a characteristic kernel function of the transmission cross coefficient, wherein said parity operator is used to project an arbitrary vector into a predetermined symmetric space, so as to constrain the arbitrary vector to be symmetrical according to the predetermined symmetry, and in the process of solving said characteristic kernel function of the transmission cross coefficient, said parity operator constrains the solved characteristic kernel function in real time to ensure that each solved kernel function satisfies the same physical symmetry of the photolithography system;

solving said photolithographic imaging model by combining said mask near-field distribution and each characteristic kernel function and obtaining an aerial image of the mask by simulation.

In one possible example, said photolithographic imaging model is as follows:

$$I(r) = \iint [M(r-r_1)]^+ A(r_1, r_2)[M(r-r_2)] dr_1 dr_2$$

Wherein, I(r) is a light intensity distribution function on the wafer surface, r denotes a position coordinate, M denotes a mask near-field function, $A(r_1, r_2)$ is a transmission cross coefficient operator for the mapping of a $r_1$ coordinate system to a $r_2$ coordinate system, and the superscript+ denotes a conjugate transpose.

In one possible example, said transmission cross coefficient is solved based on a Lanczos method, specifically:

Eigen-decomposition of the transmission cross coefficient is performed so as to achieve a fast integration of said photolithographic imaging model in order to solve said photolithographic imaging model, said eigen-decomposition process being represented as follows:

$$A(r_2, r_1) \approx \sum_{n=1}^{N} \lambda_n K_n(r_1) K_n(r_2)^+.$$

Wherein, $\lambda_n$ denotes the nth eigenvalue of the transmission cross coefficient, $K_n$ denotes the characteristic kernel function corresponding to the nth eigenvalue, and N denotes the total number of eigenvalues.

The characteristic kernel function of the transmission cross coefficient is obtained by performing an eigen-decomposition of the transmission cross coefficient, using a parity operator to ensure the symmetric properties during the numerical solution process of the transmission cross coefficient, specifically:

S1, transforming the transmission cross coefficient operator into a tridiagonal matrix based on a matrix consisting of a series of Lanczos column vectors, wherein any two Lanczos column vectors in said series of Lanczos column vectors are orthogonal to each other;

S2, determining the corresponding symmetric space according to the physical symmetry of the photolithography system and constructing the corresponding parity operator; initializing the coefficients of the tridiagonal matrix based on the known information in said tridiagonal matrix and randomly initializing the initialization vectors in the Lanczos column vector solution space;

S3, deriving the Lanczos column vector based on said initialization vector;

S4, updating the Lanczos column vector obtained this time using said parity operator to ensure that the Lanczos column vector obtained this time satisfies the physical symmetry of the photolithography system;

S5, deriving the elements at the corresponding positions on the main diagonal of the tridiagonal matrix based on the Lanczos column vector updated by the parity operator and the transmission cross coefficient operator;

S6, deriving a halfway vector based on the Lanczos column vector last derived and updated by the parity operator, the elements on the high and low diagonals of the tridiagonal matrix last derived, the transmission cross coefficient operator, and the elements on the main diagonal derived this time;

S7, taking a 2-norm of said halfway vector to obtain the elements at corresponding positions on the high and low diagonals of the tridiagonal matrix;

S8, determining whether the element on the main diagonal derived this time is 0; if it is 0, then step S9 is executed, otherwise step S10 is executed;

S9, considering each derived Lanczos column vector after being updated by the parity operator, and randomly initializing said initialization vectors again, to enter into the next iteration, i.e., jumping to perform step S3;

S10, updating the next Lanczos column vector according to the halfway vector; and then updating this vector using the parity operator; thereafter, outputting the Lanczos column vector derived this time, and determining whether the iteration reaches the maximum number of iterations, and if it does not, executing step S5, and if it does, exiting the iteration and executing step S11; and S11, determining the characteristic kernel function of the tridiagonal matrix based on the elements of the derived tridiagonal matrix, and obtaining a characteristic kernel function of the transmission cross coefficient based on the series of Lanczos column vectors output by the above iterations and the characteristic kernel function of the tridiagonal matrix.

In the second aspect, the present invention has provided an optical imaging simulation device for a photolithography system, comprising:

a photolithographic imaging model determination module for determining a photolithographic imaging model based on a transmission cross coefficient and mask near-field distribution, wherein said transmission cross coefficient reflects the physical symmetry of the photolithography system and said photolithographic imaging model is used for simulating a photolithographic imaging process to obtain an aerial image of a mask in the photolithography system;

a characteristic kernel function solving module for solving the transmission cross coefficient based on a Lanczos method and using a parity operator to ensure the symmetric properties of the transmission cross coefficient during the numerical solution process, so as to obtain a characteristic kernel function of the transmission cross coefficient, wherein said parity operator is used to project an arbitrary vector into a predetermined symmetric space, so as to constrain the arbitrary vector to be symmetric according to the predetermined symmetry, and in the process of solving the characteristic kernel functions of the transmission cross coefficient, the parity operator constrains the solved characteristic kernel functions in real time to ensure that each solved kernel function satisfies the same physical symmetry of the photolithography system;

a mask aerial image simulation module for solving said photolithographic imaging model by combining the mask near-field distribution and each characteristic kernel function and obtaining an aerial image of the mask by simulation.

In one possible example, said photolithographic imaging model is as follows:

$$I(r)=\iint [M(r-r_1)]^+ A(r_1,r_2)[M(r-r_2)]dr_1 dr_2$$

Wherein, I(r) is a light intensity distribution function on the wafer surface, r denotes a position coordinate, M denotes a mask near-field function, $A(r_1,r_2)$ is a transmission cross coefficient operator for the mapping of a $r_1$ coordinate system to a $r_2$ coordinate system, and the superscript+ denotes a conjugate transpose.

In one possible example, said characteristic kernel function solving module performs an eigen-decomposition of the transmission cross coefficient, so as to achieve a fast integration of said photolithographic imaging model in order to solve said photolithographic imaging model, said eigen-decomposition process being represented as follows:

$$A(r_2, r_1) \approx \sum_{n=1}^{N} \lambda_n K_n(r_1) K_n(r_2)^+.$$

Wherein, $\lambda_n$ denotes the nth eigenvalue of the transmission cross coefficient, $K_n$ denotes the characteristic kernel functions corresponding to the nth eigenvalue, and N denotes the total number of eigenvalues.

In one possible example, said characteristic kernel function solving module has the following workflow:

S1, transforming the transmission cross coefficient operator into a tridiagonal matrix based on a matrix consisting of a series of Lanczos column vectors, wherein any two Lanczos column vectors in said series of Lanczos column vectors are orthogonal to each other;

S2, determining the corresponding symmetric space according to the physical symmetry of the photolithography system and constructing the corresponding parity operator; initializing the coefficients of the tridiagonal matrix based on the known information in said tridiagonal matrix and randomly initializing the initialization vectors in the Lanczos column vector solution space;

S3, deriving the Lanczos column vector based on said initialization vector;

S4, updating the Lanczos column vector obtained this time using said parity operator to ensure that the Lanczos column vector obtained this time satisfies the physical symmetry of the photolithography system;

S5, deriving the elements at the corresponding positions on the main diagonal of the tridiagonal matrix based on the Lanczos column vector updated by the parity operator and the transmission cross coefficient operator;

S6, deriving a halfway vector based on the Lanczos column vector last derived and updated by the parity operator, the elements on the high and low diagonals of the tridiagonal matrix last derived, the transmission cross coefficient operator, and the elements on the main diagonal derived this time;

S7, taking a 2-norm of said halfway vector to obtain the elements at corresponding positions on the high and low diagonals of the tridiagonal matrix;

S8, determining whether the element on the main diagonal derived this time is 0; if it is 0, then step S9 is executed, otherwise step S10 is executed;

S9, considering each derived Lanczos column vector after being updated by the parity operator, and randomly initializing said initialization vectors again, to enter into the next iteration, i.e., jumping to perform step S3;

S10, updating the next Lanczos column vector according to the halfway vector; and then updating this vector using the parity operator; thereafter, outputting the Lanczos column vector derived this time, and determining whether the iteration reaches the maximum number of iterations, and if it does not, executing step S5, and if it does, exiting the iteration and executing step S11; and S11, determining the characteristic kernel function of the tridiagonal matrix based on the elements of the derived tridiagonal matrix, and obtaining a characteristic kernel function of the transmission cross coefficient based on the series of Lanczos column vectors output by the above iterations and the characteristic kernel function of the tridiagonal matrix.

In a third aspect, the present invention has provided another optical imaging simulation device for a photolithography system, comprising: a memory and a processor;

the memory being configured to store a computer program;

the processor being configured to implement, when executing said computer program, the imaging simulation method according to the first aspect as described above.

In a fourth aspect, the present invention has provided a computer-readable storage medium, where the storage medium stores a computer program, and when executed by a processor, the computer program implements the imaging simulation method according to the first aspect or any possible example in the first aspect as described above.

In a fifth aspect, the present invention has provided a computer program product, when run on a processor, causes the processor to perform the method in the first aspect or any possible example in the first aspect as described above.

In a sixth aspect, the present application has provided a chip, comprising at least one processor and an interface; the at least one processor acquires program instructions or data through the interface; and the at least one processor is configured to execute program line instructions, so as to implement the method as described in the first aspect or any possible example in the first aspect.

In general, compared with the prior art, the above technical solutions proposed in the present invention have the following beneficial effects:

for the TCC operator, which reflects the physical symmetry of the photolithography system, the present invention applies symmetry constraints in the process of solving the characteristic kernel function through iteration, to ensure that the kernel function has the symmetry corresponding to the TCC operator, thus effectively avoiding symmetry breaking caused by the floating-point number error in numerical computation, and also avoiding the tedious work of empirically selecting the kernel function, which ultimately improves the simulation efficiency as well as the simulation precision of the optical imaging system.

The present invention constructs a strong parity operator constraint, which may project an arbitrary vector into a symmetric subspace. Taking symmetry in x, y direction as an example, for a system geometrically symmetric in the x, y direction, an arbitrary operator A still has all the symmetries of the system under the action of parity operators in the x, y direction, i.e., $AP_x V(x, y)=P_x A V(x, y)$, $AP_y V(x, y)=P_y A V(x, y)$, wherein parity operators refer to operators acting on an arbitrary vector satisfying $P_x V(x, y)=P_x V(-x, y)$, $P_y V(x, y)=P_y V(x, -y)$. Since $P_x^2=P_y^2=I$, wherein I is an identity matrix, then the operators $P_x$, $P_y$ have eigenvalues $\lambda_x, \lambda_y=\pm 1$, and then it is possible to project an arbitrary vector into four symmetric subspaces $\{(\lambda_x, \lambda_y)\}=\{(+1, +1), (-1, +1), (-1, -1)-1), (+1, -1)\}$, and specifically, for the arbitrary vector, the following transformations are carried out: $V=(V+\lambda_x P_x V)/2$; $V=+\lambda_y P_y V)/2$; this ensures that the vector is projected into the symmetric subspace, thereby achieving a strong constraint on the symmetry.

The present invention employs a parity operator to constrain the characteristic kernel function in real time in the process of solving the TCC eigen-decomposition. TCC is usually described as a system operator with physical or geometric symmetry. Taking the Lanczos iterative method as an example in solving an implicit TCC operator, the Lanczos vector q generated in the iterative process is constrained by a parity operator, and only the projection part of q in the symmetric subspace is retained, so that the Lanczos vector generated in the iterative process has the corresponding symmetric property as the TCC. This ensures that the kernel function also has the corresponding symmetry, thereby effectively avoiding symmetry breaking caused by the floating-point number error of numerical computation, and also avoiding the tedious task of empirically selecting the kernel function, thereby ultimately obtaining an TCC operator without losing the physical or geometric symmetry inherent to the original photolithographic imaging system. Although the Lanczos iteration method is described herein as an example, the present invention can still be adapted to other iterative methods, such as Householder transformations or Arnoldi iteration, etc.

It is worth stating that the present invention is applied to the eigen-decomposition of TCC system operator with physical or geometric symmetry. TCC operators with physical or geometric symmetry contain symmetric properties inherent to optical imaging systems but are not necessarily represented mathematically as Hermitian symmetries. Thus, the method of the present invention is not limited to system operators that satisfy mathematical Hermitian symmetry but can also be applied to non-Hermitian operators that reflect the inherent physical or geometric symmetry of the system.

DETAILED DESCRIPTION

To make the purpose, technical solution, and advantages of the present invention clearer, the present invention is further described in detail below in connection with the accompanying drawings and embodiments. It should be understood that the specific embodiments described herein are only used to explain the present invention, but not to limit the present invention. Methods, devices, and systems of optical imaging simulation for a photolithography system are provided, including: determining a photolithographic imaging model based on a transmission cross coefficient and mask near-field distribution; solving a transmission cross coefficient based on a Lanczos method, and using a parity operator to ensure the symmetric properties of the transmission cross coefficient in the numerical solution process to obtain a characteristic kernel functions of the transmission cross coefficient. The parity operator is used to project an arbitrary vector into a predetermined symmetric space, so as to constrain the arbitrary vector to be symmetric according to the predetermined symmetry. In the process of solving the characteristic kernel function of the transmission cross coefficient, the parity operator constrains the solved characteristic kernel function in real time to ensure that each solved kernel function satisfies the same physical symmetry of the photolithography system. A photolithographic imaging model is solved by combining the mask near-field distribution and each characteristic kernel function, and an aerial image of the mask is obtained by simulation. The present disclosure prevents symmetry breaking caused by floating-point errors and improves simulation efficiency as well as simulation precision of a photolithographic imaging system.

Figure 1:
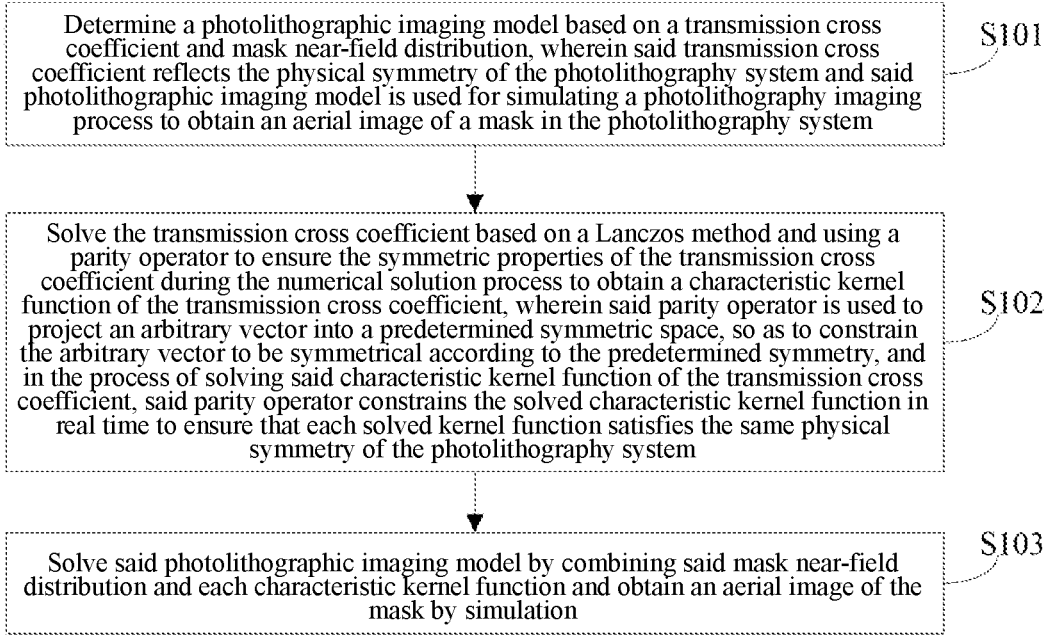
FIG. 1 is a flowchart of an optical imaging method for a photolithography system provided by an embodiment of the present invention.

FIG. 1 is a flowchart of an optical imaging method for a photolithography system provided by an embodiment of the present invention, comprising the steps of:

S101, determining a photolithographic imaging model based on a transmission cross coefficient and mask near-field distribution, wherein said transmission cross coefficient reflects the physical symmetry of the photolithography system and said photolithographic imaging model is used for simulating a photolithographic imaging process to obtain an aerial image of a mask in the photolithography system;

S102, solving the transmission cross coefficient based on a Lanczos method and using a parity operator to ensure the symmetric properties of the transmission cross coefficient during the numerical solution process to obtain a characteristic kernel function of the transmission cross coefficient, wherein said parity operator is used to project an arbitrary vector into a predetermined symmetric space, so as to constrain the arbitrary vector to be symmetrical according to the predetermined symmetry and in the process of solving said characteristic kernel function of the transmission cross coefficient, said parity operator constrains the solved characteristic kernel function in real time to ensure that each solved kernel function satisfies the same physical symmetry of the photolithography system;

S103, solving a photolithographic imaging model by combining the mask near-field distribution and each characteristic kernel function, and obtaining an aerial image of the mask by simulation.

Figure 2:
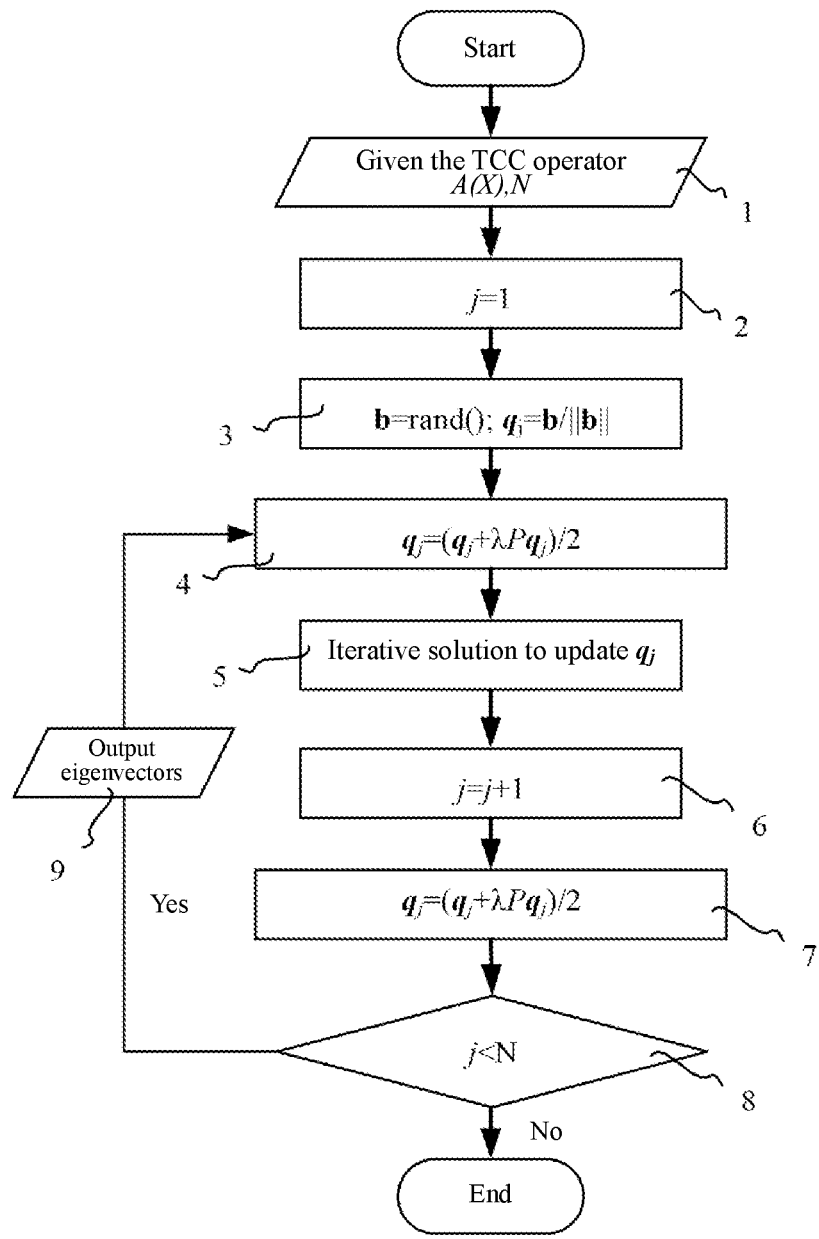
FIG. 2 is a flowchart of a method for implementing eigen-decomposition of an operator of a TCC system provided by an embodiment of the present invention.

In a specific embodiment, the present invention provides a method for implementing a transmission cross coefficient, i.e., a TCC system operator eigen-decomposition with symmetry constraints on the kernel function, comprising the following steps as shown in FIG. 2:

Step 1: a transmission cross coefficient operator TCC in the photolithography imaging system is given, which is abbreviated herein as operator A, and has physical or geometric symmetry, i.e., for the input vector V(r) and the corresponding output, it satisfies the following properties: y=A[V(r)]=A[V(—r)], wherein $A \in C^{n \times n}$, and wherein it is not necessary for operator A to have mathematical Hermitian symmetry, and the characteristic kernel function of operator A is solved by an iterative method, while setting the maximum number of iterations to be N.

Step 2: initialize an iteration number counter j=1.

Step 3: randomly initialize a vector b and assign an initial iteration vector $q_j$ as $q_j$=b/||b||.

Step 4: construct a parity operator P and project an iterative vector $q_j$ into a symmetric subspace by using the parity operator to impose symmetric constraints. The symmetric operator is defined as:

$$Pv(r) \stackrel{def}{=} v(-r)$$

The projection process may be described as follows:

$$q_j \leftarrow (q+\lambda Pq)/2$$

Wherein, $\lambda$ is an eigenvalue corresponding to the parity operator P.

Step 5: the vector $q_j$ is updated using an iterative algorithm, which is suitable for solving an eigenvalue characteristic kernel function of an implicit operator, including but not limited to Householder transform, Arnoldi iteration or Lanczos iteration, etc.

Step 6: update the iteration number counter j=j+1.

Step 7: use the constructed parity operator P again to update the iteratively updated vector q j by adding strong symmetric constraints to project it into a symmetric subspace. Thus, only the part of the projection that satisfies the symmetric subspace is retained, i.e., step 4 is repeated.

Step 8: determine whether the iteration counter j is less than a set maximum number of iterations N. If the result is "No", then the program ends.

Step 9: if the result in step 8 is "Yes", then the characteristic kernel function calculated by the iterative method (which has been symmetrically constrained in step 7) is output first, and we skip to step 4.

The present invention is applied to computing photolithographic models for eigen-decomposition implementation of a TCC operator in Hopkins imaging. The TCC operator usually has physical symmetry, reflecting the symmetric properties inherent to the photolithographic imaging system, and thus requires the corresponding symmetry of the decomposed characteristic kernel function. For the sake of brevity, the character A is used directly below to represent the TCC operator.

The technical solution of the present invention is expanded and described by means of Embodiment 1 below, which comprises the following parts:

1. In a photolithographic imaging model, the light intensity function I(r) on a wafer surface is often written as a product expression of TCC function $A(r_1,r_2)$ and the mask near-field function M:

$$I(r)=\iint [M(r-r_1)]^+ A(r_1,r_2)[M(r-r_2)]dr_1 dr_2.$$

r denotes the position coordinate, and since the TCC operator achieves the mapping from a $r_1$ coordinate system to a $r_2$ coordinate system, its explicit mathematical form is too complicated. Therefore, it is often written directly as an implicit operator. An eigen-decomposition of the TCC may be applied for fast integration of the above equation.

$$A(r_2, r_1) \approx \sum_{n=1}^{N} \lambda_n K_n(r_1) K_n(r_2)^+.$$

In addition, a photolithography system usually has physical symmetry, then the TCC function A operator reflects the corresponding symmetry. Therefore, the A reconstructed by eigen-decomposition should also have the same physical symmetry. The symmetry breaking of the TCC function can lead to a decline in the efficiency as well as the precision of the forward photolithographic imaging model, which can seriously affect the cost of the photolithographic production process.

Figure 3:
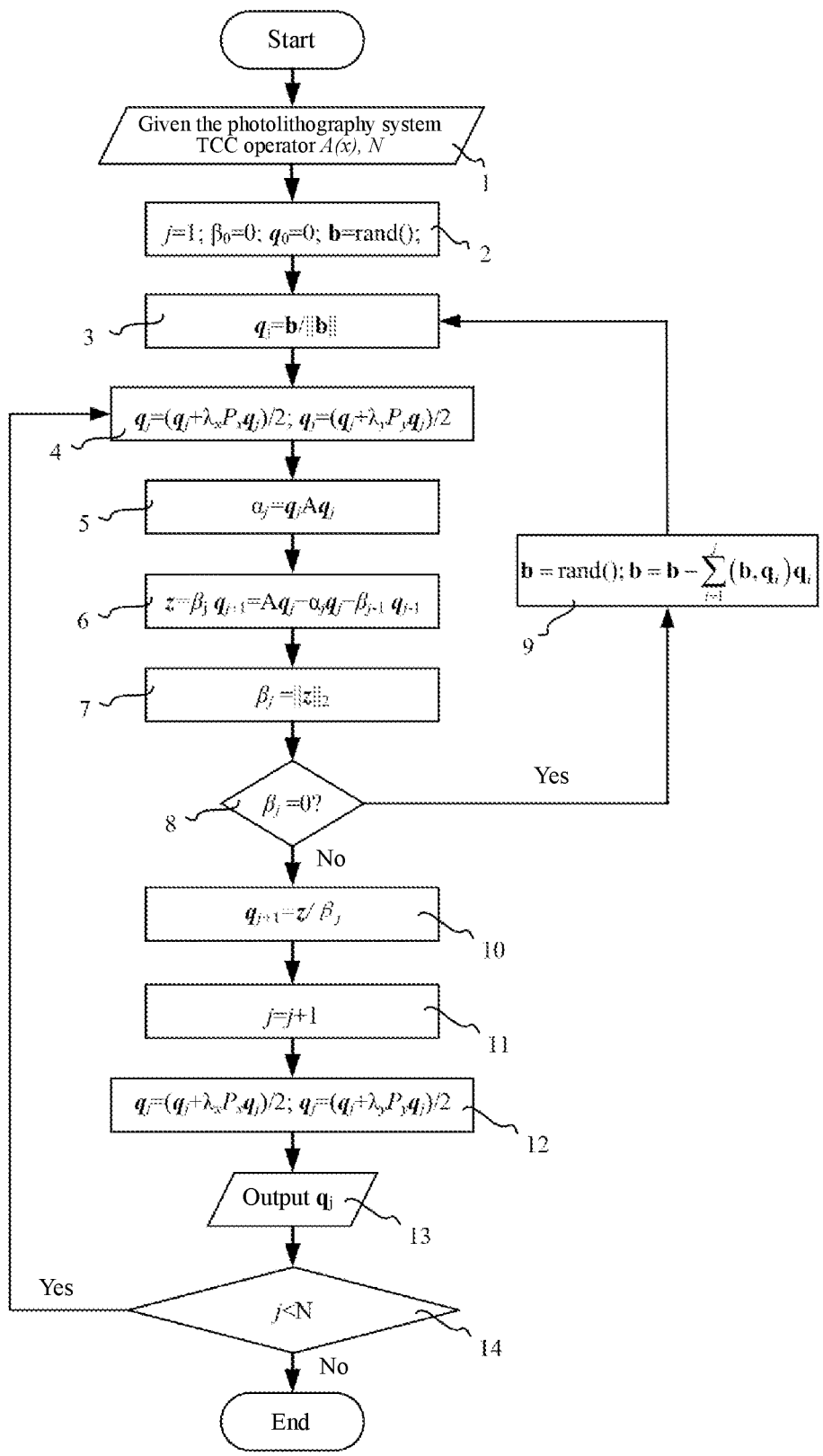
FIG. 3 is a flowchart of a method for implementing Embodiment 1 of the present invention.

2. Therefore, the present invention may be applied to solve the eigenvalues as well as the characteristic kernel functions of TCC functions, and since TCC is often described directly by implicit operators, the eigenvalues and characteristic kernel functions may be solved by an iterative method, which is described herein by the Lanczos method as an example, and the present invention is not limited to a specific iterative method, which is shown specifically in FIG. 3 and includes the following steps:

Step 1: a TCC function implicit operator A described by the photolithography system is given, and it satisfies the physical symmetric properties, i.e., its action effect satisfies: y=A[V(r)]=A[V(−r)], wherein $A \in C^{n \times n}$. The eigenvectors and kernel functions of operator A are solved through iteration, and thus the maximum number of iterations is set to N at the same time. Any operator A with physical or geometric symmetry may be transformed into a tridiagonal matrix T:

$$Q^+AQ = T = \begin{bmatrix} \alpha_1 & \beta_1 & & & \\ \beta_1 & \alpha_2 & \beta_2 & & \\ & \beta_2 & \alpha_3 & \ddots & \\ & & \ddots & \ddots & \beta_{m-1} \\ & & & \beta_{m-1} & \alpha_m \end{bmatrix}$$

Wherein the column vectors of the n×m-dimensional matrix Q, the Lanczos vectors $q_j$ are mutually orthogonal.

Step 2: initialize an iteration number counter j, initialize the coefficients $\beta_0=0$ and $q_0=0$, wherein 0 denotes a vector with all 0 elements, and randomly initialize the vector b as an initial vector in the solution space.

Step 3: assign the initial iteration vector $q_j$ as $q_j=b/\|b\|$.

Step 4: construct a parity operator P, which corresponds to all the physical symmetric properties required by the optical imaging system. Wherein, the physical symmetric properties required by the optical imaging system includes at least one of: x-axis symmetry, y-axis symmetry, or centrosymmetry, etc.

For example, if the parity operator corresponds to x-axis symmetry and y-axis symmetry, and if the symmetric operators satisfying the mirror invariance in the x- and y-directions are $P_x$ and $P_y$, then for any vector we have:

$$P_x v(x,y) \stackrel{\text{def}}{=} v(-x,y)$$

$$P_y v(x,y) \stackrel{\text{def}}{=} v(-x,-y)$$

According to the above equation, $P_x^2 = P_y^2 = I$, wherein I is an identity matrix, i.e., the operators $P_x$ and $P_y$ have eigenvalues $\lambda_x$ and $\lambda_y = \pm 1$. Then it is possible to project an arbitrary vector into four symmetric subspaces $\{(\lambda_x, \lambda_y)\} = \{(+1, +1), (-1, +1), (-1, -1), (+1, -1)\}$.

The iterative vector $q_j$ is updated using a parity operator: $q_j = (q_j + \lambda_x P_x \, q_j)/2$; $q_j = (q_j + \lambda_y P_y \, q_j)/2$; this ensures that the vector is projected into the symmetric subspace, thereby achieving a strong constraint on symmetry.

Step 5: update $\alpha_j = q_j^+ A \, q_j$ according to the iteration steps of the Lanczos method.

Step 6: update $z = \beta_j q_{j+1} = A q_j - \alpha_j q_j - \beta_{j-1} q_{j-1}$ according to the iteration steps of the Lanczos method.

Step 7: solve coefficient $\beta_j = \|z\|_2$ based on the result in Step 6.

Step 8: determine whether the coefficient $\beta_j$ is 0. If yes, skip to step 9, and if not, continue with step 10 to update the vector Step 9: randomly initialize a vector b and subtract its projection in the space constructed by the first j terms $(q_1, q_2, \ldots q_1)$, then immediately skip to step 3.

Step 10: update the vector $q_{j+1}$: $q_{j+1} = z/\beta_j$

Step 11: update the iteration counter operation j=j+1.

Step 12: use the constructed parity operator P again to impose strong symmetric constraint on the iteratively updated vector q j and project it into a symmetric subspace. Thus, only the part of the projection that satisfies the symmetric subspace is retained, i.e., step 4 is repeated.

Step 13: output vector

Step 14: determine whether the iteration number counter j is less than the set maximum number of iterations N. If the result is no, the program ends. If the result is yes, then skip to step 4.

3. Based on the output series of vectors, the Lanczos vectors $q_j$, the n×m-dimensional matrix Q can be obtained. Thus, the operator A is transformed into a tridiagonal matrix T: $Q^+AQ=T$. Then the eigenvalues of the operator A are equal to the eigenvalues of T and the characteristic kernel function K of A may also be expressed by the characteristic kernel function V of tridiagonal matrix T: K=QV. Thus, the eigendecomposition of the function TCC operator A is obtained, and the kernel function of its eigendecomposition satisfies the symmetric properties inherent to the optical imaging system.

Figure 4:
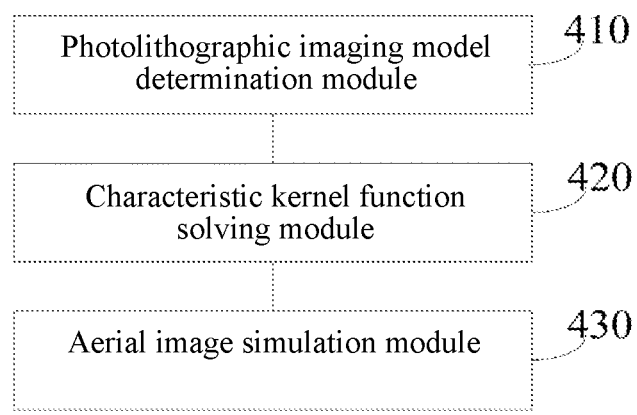
FIG. 4 is an architectural diagram of an optical imaging device for a photolithography system provided by an embodiment of the present invention.

FIG. 4 shows an architectural diagram of an optical imaging simulation device for a photolithography system provided by embodiments of the present invention, as shown in FIG. 4, and it includes:

a photolithographic imaging model determination module 410 for determining a photolithographic imaging model based on a transmission cross coefficient and mask near-field distribution, wherein said transmission cross coefficient reflects the physical symmetry of the photolithography system and said photolithographic imaging model is used to simulate a photolithographic imaging process to obtain the aerial image of a mask in the photolithography system;

a characteristic kernel function solving module 420 for solving a transmission cross coefficient based on a Lanczos method and using a parity operator to ensure the symmetric properties of the transmission cross coefficient during the numerical solution process to obtain a characteristic kernel function of the transmission cross coefficient, wherein said parity operator is used to project an arbitrary vector into a predetermined symmetric space, so as to constrain the arbitrary vector to be symmetrical according to a predetermined symmetry, and during the process of solving a characteristic kernel function of said transmission cross coefficient, said parity operator constrains the solved characteristic kernel function in real time to ensure that each solved kernel function satisfies the same physical symmetry of the photolithography system;

an aerial image simulation module 430 for solving said photolithographic imaging model in combination with said mask near-field distribution and said each characteristic kernel function to simulate the aerial image of a mask.

It can be understood that for the detailed implementation of functions of each aforementioned module, the descriptions of the foregoing method embodiments may be referred to, which will not be repetitively described herein.

Further, embodiments of the present invention have provided another mask imaging simulation device for a photolithography system, comprising: a memory and a processor;

the memory being configured to store a computer program;

said processor being configured to implement said imaging simulation method when said computer program is run.

In addition, the present invention has further provided a computer-readable storage medium, wherein the storage medium stores a computer program, and when executed by a processor, the computer program implements the above imaging simulation method.

Based on the method in the above embodiments, the embodiments of the present invention have provided a computer program product, when run on a processor, causes the processor to perform the method according to the above embodiments.

Based on the method in the above embodiments, the embodiments of the present invention have further provided a chip comprising one or more processors and an interface circuit. Optionally, the chip may further contain a bus. Wherein:

the processor may be an integrated circuit chip that has the ability to process signals. In the implementation process, the steps of the above method may be implemented by an integrated logic circuit in the hardware of the processor or by instructions in the form of software. The above processor may be a general-purpose processor, digital signal processor (DSP), application specific integrated circuit (ASIC), field programmable gate array (FPGA) or other programmable logic devices, discrete gate or transistor logic devices or discrete hardware component. It is possible to implement or perform each method and step disclosed in the embodiments of the present application. The general-purpose processor may be a microprocessor or the processor may also be any conventional processor, etc.

The interface circuit may be used to send or receive data, instructions or information, and the processor may use the data, instructions or other information received by the interface circuit for processing and can send the processed information out through the interface circuit.

Optionally, the chip further includes a memory, which may include a read-only memory and random-access memory and provide operational instructions and data to the processor. A portion of the memory may also include a non-volatile random-access memory (NVRAM).

Optionally, the memory stores executable software modules or data structures, and the processor can perform the corresponding operations by calling the operation instructions stored in the memory (which may be stored in the operating system).

Optionally, the interface circuit may be used to output execution results of the processor.

It should be noted that the respective functions of the processor and the interface circuit can be implemented either by a hardware design or by software design, or by a combination of software and hardware, which is not limited herein.

It should be understood that the steps of the above method embodiments may be accomplished by a logic circuit in the form of hardware in the processor or by instructions in the form of software.

It can be understood that the sequence of the serial numbers of the steps in the above embodiments does not imply the order of execution, and the order of execution of each process shall be determined by its function and intrinsic logic and shall not constitute any limitation to the implementation process of the embodiments of the present application. In addition, in some possible implementations, the steps in the above embodiments may be optionally performed, either partially or fully performed, as the case may be, which is not limited herein.

It can be understood that the processor in embodiments of the present application may be a central processing unit (CPU), and also other general-purpose processors, a digital signal processors (DSP), an application specific integrated circuit (ASIC), a field programmable gate array (FPGA) or other programmable logic devices, transistor logic devices, hardware components, or any combination thereof. The general-purpose processor may be a microprocessor or any conventional processor.

The methods and steps in the embodiments of the present application may be implemented by means of hardware or software instructions executed by a processor. Software instructions may consist of corresponding software modules, which may be stored in a random-access memory (RAM), flash memory, read-only memory (ROM), programmable rom (PROM), erasable FROM (EPROM), electrically EPROM (EPROM), register, hard disk, mobile hard disk, CD-ROM, or any other form of storage media well known in the art. An exemplary storage medium is coupled to a processor such that the processor can read information from the storage medium and can write information to the storage medium. Of course, the storage medium may also be an integral part of the processor. The processor and storage medium may be located in the ASIC.

In the above embodiments, this may be achieved in whole or in part by software, hardware, firmware, or any combination thereof. When implemented using software, it may be implemented in whole or in part as a computer program product. Said computer program product includes one or more computer instructions. When loading and executing said computer program instructions on a computer, a process or function according to the embodiments of the present application is generated in whole or in part. Said computer may be a general-purpose computer, a dedicated computer, a computer network, or other programmable device. Said computer instructions may be stored in a computer readable storage medium or transmitted via said computer readable storage medium. Said computer instructions may be transmitted from one website, computer, server, or data center to another website, computer, server, or data center via wired (e.g., coaxial cable, fiber optic, digital subscriber line (DSL)) or wireless (e.g., infrared, wireless, microwave, etc.) means. Said computer-readable storage media may be any available media that the computer can access or a data storage device such as a server, data center, etc. containing one or more integrated media that are available. Said available media may be magnetic media, (e.g., floppy disk, hard disk, or magnetic tape), optical media (e.g., DVD), or semiconductor media (e.g., solid state disk (SSD)), etc.

It can be easily understood by those skilled in the art that the foregoing description is only preferred embodiments of the present invention and is not intended to limit the present invention. All the modifications, identical replacements and improvements within the spirit and principle of the present invention should be in the scope of protection of the present invention.

The invention claimed is:

1. An optical imaging simulation method for a photolithography system, comprising the steps of:
    determining a photolithographic imaging model based on a transmission cross coefficient and mask near-field distribution, wherein said transmission cross coefficient reflects the physical symmetry of the photolithography system and said photolithographic imaging model is used for simulating a photolithographic imaging process to obtain an aerial image of a mask in the photolithography system;
    solving the transmission cross coefficient based on a Lanczos method and using a parity operator to ensure the symmetric properties of the transmission cross coefficient during the numerical solution process to obtain a characteristic kernel function of the transmission cross coefficient, wherein said parity operator is used to project an arbitrary vector into a predetermined symmetric space, so as to constrain the arbitrary vector to be symmetrical according to the predetermined symmetry, and in the process of solving said characteristic kernel function of the transmission cross coefficient, said parity operator constrains the solved characteristic kernel function in real time to ensure that each solved kernel function satisfies the same physical symmetry of the photolithography system;
    solving a photolithographic imaging model by combining the mask near-field distribution and each characteristic kernel function and obtaining an aerial image of the mask by simulation.

2. The method according to claim 1, wherein said photolithographic imaging model is as follows:

$$I(r)=\iint [M(r-r_1)]^+ A(r_1,r_2)[M(r-r_2)]dr_1 dr_2$$

wherein, I(r) is a light intensity distribution function on the wafer surface, r denotes a position coordinate, M denotes a mask near-field function, $A(r_1,r_2)$ is a transmission cross coefficient operator for the mapping of a $r_1$ coordinate system to a $r_2$ coordinate system, and the superscript+denotes a conjugate transpose.

3. The method according to claim 2, wherein said transmission cross coefficient is solved based on a Lanczos method, specifically:
    eigen-decomposition of the transmission cross coefficient is performed so as to achieve a fast integration of said photolithographic imaging model in order to solve said photolithographic imaging model, said eigen-decomposition process being represented as follows:

$$A(r_2, r_1) \approx \sum_{n=1}^{N} \lambda_n K_n(r_1) K_n(r_2)^+.$$

wherein, $\lambda_n$ denotes the nth eigenvalue of the transmission cross coefficient, $K_n$ denotes the characteristic kernel function corresponding to the n-th eigenvalue, and N denotes the total number of eigenvalues.

4. The method according to claim 3, wherein the characteristic kernel function of the transmission cross coefficient is obtained by performing an eigen-decomposition of the transmission cross coefficient, using the parity operator to ensure the symmetric properties during the numerical solution process of the transmission cross coefficient, specifically:
    S1, transforming the transmission cross coefficient operator into a tridiagonal matrix based on a matrix consisting of a series of Lanczos column vectors, wherein any two Lanczos column vectors in said series of Lanczos column vectors are orthogonal to each other;
    S2, determining the corresponding symmetric space according to the physical symmetry of the photolithography system and constructing the corresponding parity operator; initializing the coefficients of the tridiagonal matrix based on the known information in said tridiagonal matrix and randomly initializing the initialization vectors of the Lanczos column vector solution space;
    S3, deriving the Lanczos column vector based on said initialization vector;
    S4, updating the Lanczos column vector obtained this time using said parity operator to ensure that the Lanczos column vector obtained this time satisfies the physical symmetry of the photolithography system;
    S5, deriving elements at the corresponding positions on the main diagonal of the tridiagonal matrix based on the Lanczos column vector updated by the parity operator and the transmission cross coefficient operator;
    S6, deriving a halfway vector based on the Lanczos column vector last derived and updated by the parity operator, the elements on the high and low diagonals of the tridiagonal matrix last derived, the transmission cross coefficient operator, and the elements on the main diagonal derived this time;
    S7, taking a 2-norm of said halfway vector to obtain the elements at corresponding positions on the high and low diagonals of the tridiagonal matrix;
    S8, determining whether the element on the main diagonal derived this time is 0; if it is 0, then step S9 is executed, otherwise step S10 is executed;
    S9, considering each derived Lanczos column vector after being updated by the parity operator, and randomly initializing said initialization vectors again, to enter into the next iteration, i.e., jumping to perform step S3;

S10, updating the next Lanczos column vector according to the halfway vector; and then updating this vector using the parity operator; thereafter, outputting the Lanczos column vector derived this time, and determining whether the iteration reaches the maximum number of iterations, and if it does not, executing step S5, and if it does, exiting the iteration and executing step S11; and S11, determining the characteristic kernel function of the tridiagonal matrix based on the elements of the derived tridiagonal matrix, and obtaining a characteristic kernel function of the transmission cross coefficient based on the series of Lanczos column vectors output by the above iterations and the characteristic kernel function of the tridiagonal matrix.

5. An optical imaging simulation device for a photolithography system, comprising:

a photolithographic imaging model determination module for determining a photolithographic imaging model based on a transmission cross coefficient and mask near-field distribution, wherein said transmission cross coefficient reflects the physical symmetry of the photolithography system and said photolithographic imaging model is used for simulating a photolithographic imaging process to obtain an aerial image of a mask in the photolithography system;

a characteristic kernel function solving module for solving the transmission cross coefficient based on a Lanczos method and using a parity operator to ensure the symmetric properties of the transmission cross coefficient during the numerical solution process, so as to obtain a characteristic kernel function of the transmission cross coefficient, wherein said parity operator is used to project an arbitrary vector into a predetermined symmetric space, so as to constrain the arbitrary vector to be symmetric according to the predetermined symmetry and in the process of solving the characteristic kernel function of the transmission cross coefficient, the parity operator constrains the solved characteristic kernel function in real time to ensure that each solved kernel function satisfies the same physical symmetry of the photolithography system; and a mask aerial image simulation module for solving said photolithographic imaging model by combining the mask near-field distribution and each characteristic kernel function and obtaining an aerial image of the mask by simulation.

6. The device according to claim 5, wherein said photolithographic imaging model is as follows:

$$I(r)=\iint [M(r-r_1)]^+ A(r_1,r_2)[M(r-r_2)]dr_1 dr_2$$

Wherein, I(r) is a light intensity distribution function on the wafer surface, r denotes a position coordinate, M denotes a mask near-field function, $A(r_1,r_2)$ is a transmission cross coefficient operator for the mapping of a $r_1$ coordinate system to a $r_2$ coordinate system, and the superscript+denotes a conjugate transpose.

7. The device according to claim 6, wherein said characteristic kernel function solving module performs an eigen-decomposition of the transmission cross coefficient, so as to achieve a fast integration of said photolithographic imaging model in order to solve said photolithographic imaging model, said eigen-decomposition process being represented as follows:

$$A(r_2, r_1) \approx \sum_{n=1}^{N} \lambda_n K_n(r_1) K_n(r_2)^+.$$

Wherein, $\lambda_n$ denotes the n-th eigenvalue of the transmission cross coefficient, $K_n$ denotes the characteristic kernel function corresponding to the n-th eigenvalue, and N denotes the total number of eigenvalues.

8. The device according to claim 7, wherein said characteristic kernel function solving module has the following workflow:

S1, transforming the transmission cross coefficient operator into a tridiagonal matrix based on a matrix consisting of a series of Lanczos column vectors, wherein any two Lanczos column vectors in said series of Lanczos column vectors are orthogonal to each other;

S2, determining the corresponding symmetric space according to the physical symmetry of the photolithography system and constructing the corresponding parity operator; initializing the coefficients of the tridiagonal matrix based on the known information in said tridiagonal matrix and randomly initializing the initialization vectors in the Lanczos column vector solution space;

S3, deriving the Lanczos column vector based on said initialization vector;

S4, updating the Lanczos column vector obtained this time using said parity operator to ensure that the Lanczos column vector obtained this time satisfies the physical symmetry of the photolithography system;

S5, deriving elements at the corresponding positions on the main diagonal of the tridiagonal matrix based on the updated Lanczos column vector of the parity operator and the transmission cross coefficient operator;

S6, deriving a halfway vector based on the Lanczos column vector last derived and updated by the parity operator, the elements on the high and low diagonals of the tridiagonal matrix last derived, the transmission cross coefficient operator, and the elements on the main diagonal derived this time;

S7, taking a 2-norm of said halfway vector to obtain the elements at corresponding positions on the high and low diagonals of the tridiagonal matrix;

S8, determining whether the element on the main diagonal derived this time is 0; if it is 0, then step S9 is executed, otherwise step S10 is executed;

S9, considering each derived Lanczos column vector after being updated by the parity operator, and randomly initializing said initialization vectors again, to enter into the next iteration, i.e., jumping to perform step S3;

S10, updating the next Lanczos column vector according to the halfway vector; and then updating this vector using the parity operator; thereafter, outputting the Lanczos column vector derived this time, and determining whether the iteration reaches the maximum number of iterations, and if it does not, executing step S5, and if it does, exiting the iteration and executing step S11; and S11, determining the characteristic kernel functions of the tridiagonal matrix based on the elements of the derived tridiagonal matrix, and obtaining a characteristic kernel function of the transmission cross coefficient based on the series of Lanczos column vectors output by the above iterations and the characteristic kernel function of the tridiagonal matrix.

9. An optical imaging simulation system for a photolithography system, comprising: a memory and a processor:
- the memory being configured to store a computer program; and
- the processor being configured to implement, when executing said computer program, the imaging simulation method according to claim 1.

10. A computer-readable storage medium, wherein the storage medium stores a computer program, and when executed by a processor, the computer program implements the imaging simulation method according to claim 1.

* * * * *